(12) United States Patent
Tihanyi

(10) Patent No.: US 6,686,614 B2
(45) Date of Patent: Feb. 3, 2004

(54) SEMICONDUCTOR SWITCHING ELEMENT WITH INTEGRATED SCHOTTKY DIODE AND PROCESS FOR PRODUCING THE SWITCHING ELEMENT AND DIODE

(75) Inventor: Jenoe Tihanyi, Kircheim (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/867,503

(22) Filed: May 30, 2001

(65) Prior Publication Data

US 2002/0000566 A1 Jan. 3, 2002

(30) Foreign Application Priority Data

May 30, 2000 (DE) .......................... 100 26 740

(51) Int. Cl.[7] .......................... H01L 29/91; H01L 29/96
(52) U.S. Cl. .......................... 257/155; 257/329
(58) Field of Search .......................... 257/155, 156, 257/328–9, 335, 355

(56) References Cited

U.S. PATENT DOCUMENTS 3,956,527 A * 5/1976 Magdo et al. ................ 427/84
4,823,172 A * 4/1989 Mihara ........................ 357/15
5,886,383 A    3/1999 Kinzer
6,049,108 A    4/2000 Williams et al.
6,191,447 B1 * 2/2001 Baliga ........................ 257/330

FOREIGN PATENT DOCUMENTS

WO    WO 00/51167    8/2000

* cited by examiner

*Primary Examiner*—Nathan J. Flynn
*Assistant Examiner*—Johannes P Mondt
(74) *Attorney, Agent, or Firm*—Laurence A. Greenberg; Werner H. Stemer; Ralph E. Locher

(57) ABSTRACT

The invention relates to an integrated semiconductor switching element, that includes a semiconductor body having a first connection zone of a first conduction type and a second connection zone of the first conduction type. A body zone of a second conduction type is located in the semiconductor body. The body zone is located between the first connection zone and the second connection zone. A control electrode is located alongside the body zone and is insulated from the semiconductor body. A Schottky barrier is located on the second connection zone. A first connection electrode is electrically conductively connected to the first connection zone and to the Schottky barrier. The invention also relates to a process for producing a semiconductor switching element.

7 Claims, 8 Drawing Sheets

85 74 10 40 30  22

74 10 30 22 40

SEMICONDUCTOR SWITCHING ELEMENT WITH INTEGRATED SCHOTTKY DIODE AND PROCESS FOR PRODUCING THE SWITCHING ELEMENT AND DIODE

BACKGROUND OF THE INVENTION

Field of the Invention

The present invention relates to a semiconductor switching element with an integrated Schottky diode.

It is known to use semiconductor switching elements, such as for example MOSFETs (Metal-Oxide Field-Effect Transistors), as switches for driving loads. FIG. 1 shows an application example in which a MOSFET T1 is used as a freewheeling element in a switching converter (buck converter) which serves for applying a DC voltage V1 to a load RL. If in the exemplary embodiment a series connection including a coil L and a parallel connection made up of a capacitance C and a load RL is connected to a supply voltage V1 via a second MOSFET T2 with MOSFET T1 turned off, a current flows through the coil L. After the second MOSFET T2 is turned off, a voltage is induced in the coil L and could lead to the switching converter being destroyed or damaged if the first MOSFET T1 were not conducting in order to complete the circuit of the coil L and the capacitance C with the load connected in parallel. Before the MOSFET Ti, driven by a drive circuit IC, conducts fully in this case, a Schottky diode D1, connected in parallel with the drain-source path of the MOSFET T1, takes over the freewheeling current and consequently prevents destruction of the switching converter.

Use of the MOSFET T1 has the advantage of lower power loss in comparison with simple use of a diode, since a lower voltage drops across the conducting MOSFET T1 than across a conducting diode. Unlike in the case of diodes with a pn junction, a charge which could lead to delayed blocking of the diode is not stored in the Schottky diode in the conducting state. With the Schottky diode, the high switching frequencies required in switching converters can consequently be achieved.

Until now, a separate MOSFET and a separate Schottky diode have been used as freewheeling elements, connected in the way represented in FIG. 1.

SUMMARY OF THE INVENTION

It is accordingly an object of the invention to provide a semiconductor switching element and a method of producing the switching element which overcomes the above-mentioned disadvantageous of the prior art apparatus of this general type. In particular, it is an object of the invention to provide a semiconductor switching element in which a transistor which can be controlled by a field effect and a Schottky diode are integrated in a semiconductor body.

With the foregoing and other objects in view there is provided, in accordance with the invention an integrated semiconductor switching element, that includes a semiconductor body having a first connection zone of a first conduction type and a second connection zone of the first conduction type. A body zone of a second conduction type is located in the semiconductor body. The body zone is located between the first connection zone and the second connection zone. A control electrode is located alongside the body zone and is insulated from the semiconductor body. A Schottky barrier is located on the second connection zone. A first connection electrode is electrically conductively connected to the first connection zone and to the Schottky barrier.

In accordance with an added feature of the invention, the body zone is formed in a well-like manner in the second connection zone; the first connection zone is formed in a well-like manner in the body zone; a contact hole is formed in the semiconductor body and passes through the first connection zone and the body zone; and the Schottky barrier is located in the contact hole.

In accordance with an additional feature of the invention, the contact hole has a bottom and side walls; the Schottky barrier is formed on the bottom of the contact hole; and a second insulation layer is located on the side walls of the contact hole.

In accordance with another feature of the invention, the semiconductor body has a front side; the first connection electrode at least partially covers the side walls and the bottom of the contact hole; and the first connection electrode at least partially covers the front side of the semiconductor body for electrically bonding the first connection zone.

In accordance with a further feature of the invention, the Schottky barrier has platinum silicide.

With the foregoing and other objects in view there is provided, in accordance with the invention a process for producing the semiconductor switching element, which includes steps of: providing a semiconductor body having a front side and having a first connection zone of a first conduction type and a second connection zone of the first conduction type, and configuring the first connection zone and the second connection zone one on top of the other; providing the semiconductor body with a body zone of a second conduction type that is located between the first connection zone and the second connection zone; producing at least one control electrode that is insulated from the semiconductor body and that is located alongside the body zone on the front side of the semiconductor body; producing the control electrode such that the first connection zone is at least partially exposed and defines exposed regions of the first connection zone on the front side of the semiconductor body; producing a first contact hole in the semiconductor body that passes from the front side of the semiconductor body through the first connection zone and through the body zone and that reaches into the second connection zone; producing a Schottky barrier in the second connection zone in the contact hole; and producing a first connection electrode that electrically bonds the Schottky barrier and the exposed regions of the first connection zone.

In accordance with an added mode of the invention, before producing the first connection electrode, an insulation layer is applied, at least to regions of the body zone that are exposed in the contact hole.

In accordance with an additional mode of the invention, before producing the first connection electrode, the side faces of the contact hole are completely covered with a first insulation layer.

In accordance with another mode of the invention, the step of producing the control electrode includes: applying an insulation layer to the front side of the semiconductor body; applying an electrode layer to the insulation layer; producing a second contact hole in the electrode layer and in the insulation layer such that the first connection zone is at least partially exposed on the front side of the semiconductor body; and applying a further insulation layer to exposed regions of the control electrode.

In accordance with a further mode of the invention, the first contact hole has a smaller diameter than the second contact hole.

In accordance with a concomitant mode of the invention, the Schottky barrier is produced by doping platinum silicide into the second connection zone.

Other features which are considered as characteristic for the invention are set forth in the appended claims.

Although the invention is illustrated and described herein as embodied in a semiconductor switching element with integrated Schottky diode and process for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
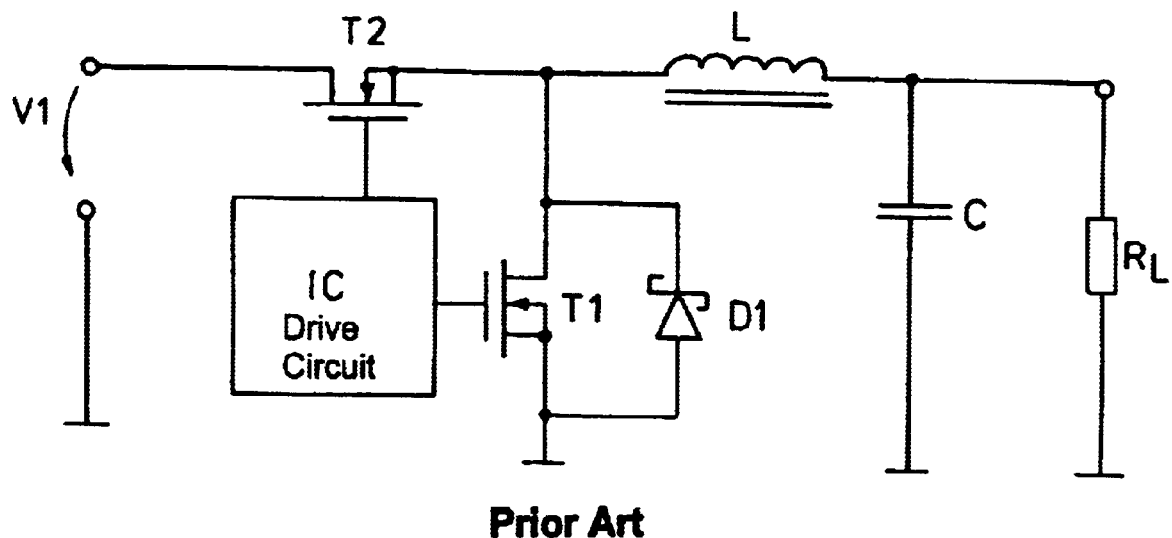
FIG. 1 shows an exemplary embodiment illustrating use of a semiconductor switch with a parallel Schottky diode.

Unless otherwise indicated, the same reference numerals designate the same parts and regions with the same meaning in the figures.

Figure 2:
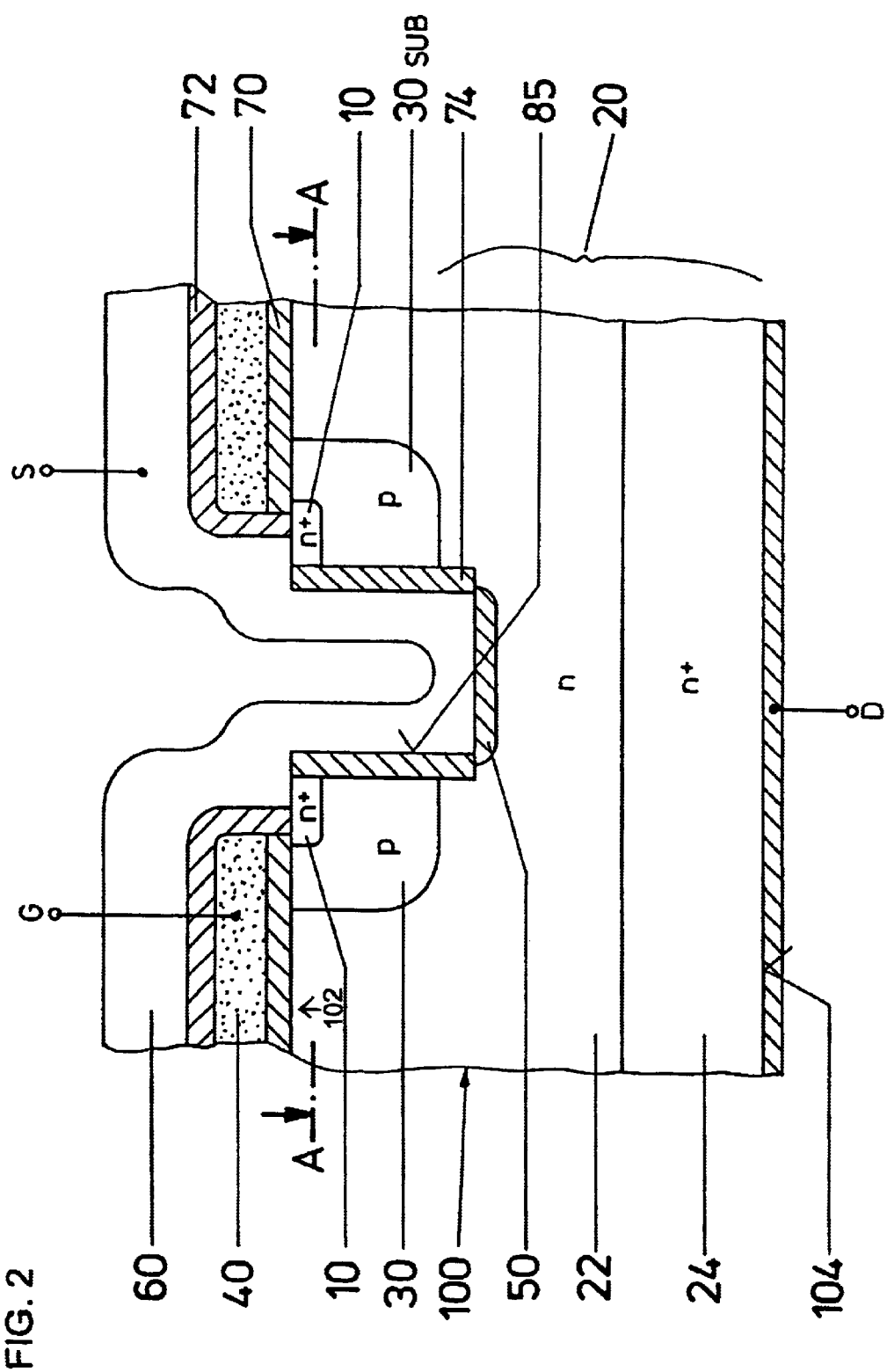
FIG. 2 shows a cross section of an exemplary embodiment of a semiconductor switching element according to the invention.

Referring now to the figures of the drawing in detail and first, particularly, to FIG. 1 thereof, there is shown an exemplary embodiment of a semiconductor switching element according to the invention. FIG. 2 shows the electrical equivalent circuit diagram of the semiconductor switching element represented in FIG. 1. Without restricting generality, the invention is described below using an n-channel field-effect transistor with a parallel Schottky diode. The invention can be correspondingly applied to the use of a p-channel transistor, in which case the n-doped regions described below must be substituted by p-doped regions and the p-doped regions must be substituted by n-doped regions. Moreover, the polarity of the voltage required for operating the semiconductor switching element must be reversed.

The semiconductor switching element according to the invention has a first connection zone 10 and a second connection zone 20, which are arranged in a semiconductor body 100. The first and second connection zones 10, 20 are of a first type of conduction and, in the exemplary embodiment, are n-doped. The second connection zone 20 has a strongly n-doped region 24 and a less strongly n-doped region 22, the strongly n-doped region 24 being arranged in the region of a rear side 104 of the semiconductor body 100.

In the more weakly doped region 22 of the second connection zone 20, at least one p-conducting body zone 30 is arranged, the strongly n-doped connection zone 10 being formed in a well-like manner in the body zone 30. The body zone 30 is arranged completely between the first and second connection zones 10, 20 and separates the first and second connection zones 10, 20.

Arranged on a front side 102 of the semiconductor body 100 lying opposite the rear side 104 of the semiconductor body is a control electrode 40, which extends alongside the body zone 30 and reaches from the first connection zone 10 to the second connection zone 20. The control electrode 40 is insulated from the semiconductor body 100 by an insulation layer 70.

The first connection zone 10 forms the source zone of a MOSFET, which is formed by the first and second connection zones 10, 20, the control electrode 40 with insulation layer 70 and the body zone 30. The MOSFET is electrically bonded by means of a first connection electrode 60 (also designated with the reference character S). The first connection electrode 60, S forms, inter alia, the source electrode of the MOSFET. The control electrode 40, which forms the gate electrode G of the MOSFET, is arranged on the front side 102 of the semiconductor body in such a way that part of the front side 102 with the first connection zone 10 is exposed, so that the source electrode 60, S can electrically bond the first connection zone 10 at this exposed region. The second connection zone 20 forms the drain zone of the MOSFET and, in the exemplary embodiment, is electrically bonded by means of a drain electrode D, which is applied as a layer of electrically conducting material, preferably of aluminum or polysilicon, to the rear side of the semiconductor body 100.

The semiconductor switching element according to the invention also has a Schottky contact at the second connection zone 20. For this purpose, one zone 50 is formed from a material suitable for forming a Schottky contact, for example a metal or platinum silicide, on the bottom of a contact hole 85 in the semiconductor body 100. The contact hole 85 reaches from the front side 102 of the semiconductor body 100 to the second connection zone 20. Regions of the first connection zone 10 and of the body zone 30 are located alongside the side walls of the contact hole 85. The Schottky contact 50 is likewise electrically bonded by means of the first connection electrode 60, S. The first connection electrode 60, S extends from the first connection zone 10 in a direction along the side walls of the contact hole 85 and is insulated from the body zone 30 by a second insulation layer 74. In the exemplary embodiment, the insulation layer 74 completely covers the side faces of the contact hole 85 and consequently also insulates regions of the first and second connection zones 10, 20 from the first connection electrode. A second insulation layer completely covering the side faces is easier to produce than a second insulation layer only partially covering the side faces. Nevertheless, a second insulation layer which only insulates the body zone 30 and the second connection zone 20 from the first connection electrode 60, S in the contact hole 85 is adequate. The first connection electrode 60, S also covers the control electrode 40, a further insulation layer 72 being arranged between the first connection electrode 60, S and the control electrode 40 for insulation purposes.

Figure 3:
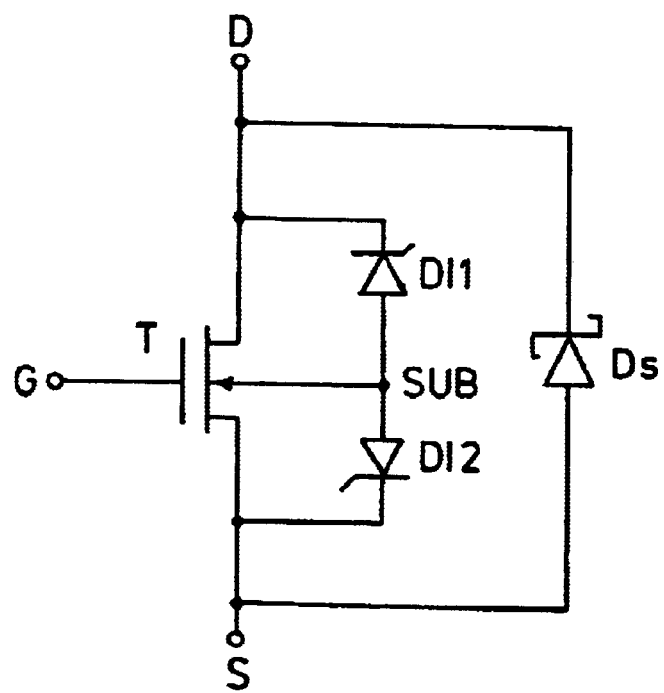
FIG. 3 shows an electrical equivalent circuit diagram of the semiconductor switching element according to the invention.

FIG. 3 shows the electrical equivalent circuit diagram of the semiconductor switching element shown in FIG. 2. The equivalent circuit diagram has a field-effect transistor T with a gate connection G, which is formed by the control electrode 40 in FIG. 2, a source connection S, which is formed by the first connection electrode 60 in FIG. 2, and a drain connection D, which is formed by the drain electrode in FIG. 2. A body connection SUB is formed by the body zone 30 in FIG. 2. Connected between the body connection SUB and the source connection S is a first diode DI1, which is formed by the pn junction between the body zone 30 and the first connection zone 10 in FIG. 2. Furthermore, a second diode DI2 is connected between the body connection 30 and the drain connection, the second diode being formed by the pn junction between the body zone 30 and the second connection zone. Furthermore, a Schottky diode Ds is connected in the direction of flow between the drain connection D and the source connection S. This Schottky diode Ds is formed by the Schottky contact 50 on the bottom of the contact hole, which is electrically bonded—like the source zone 10 also—by the first connection electrode 60, S.

If a voltage is applied to the semiconductor switching element according to the invention in the drain-source direction, both the first diode DI1 (the pn junction between the body zone 30 and first connection zone 10) and the Schottky diode Ds (the Schottky contact 50 in the first connection zone) block. A current flow from drain D to source S is only produced if a positive drive potential is applied to the gate electrode G, whereby a conducting channel forms in the body zone 30 beneath the control electrode 40 along the front side 102 of the semiconductor body between the first connection zone 10 (source zone) and the second connection zone 20 (drain zone).

If a voltage is applied in the source-drain direction, the second diode DI2 blocks and the Schottky diode Ds conducts. When a positive drive potential is applied to the gate electrode, a conducting channel likewise forms in the body zone 30. The Schottky diode then blocks when the MOSFET T is driven, if the voltage drop across the source-drain path of the MOSFET T is less than the voltage required to make the Schottky diode Ds conducting. In the case of the semiconductor switching element according to the invention, the integrated Schottky diode Ds serves as a freewheeling element which takes over a current in the source-drain direction until the MOSFET present in the semiconductor switching element and driven by an external drive circuit (not represented) takes over this current. Unlike in diodes with a pn junction, no charge carriers, which could keep the diodes in the conducting state after removal of the voltage, are stored in conducting Schottky diodes. Consequently, the Schottky diode cannot cause switching delays, as a result of which, the semiconductor switching element according to the invention can also be used for switching at high switching frequencies, in particular in buck converters.

The detail represented in FIG. 2 taken from the semiconductor switching element according to the invention preferably represents only one cell of a semiconductor switching element which is made up of a multiplicity of cells of this type arranged next to one another. In this case, the gate and source connections G, S of all the cells are connected to a common connection in each case, to allow all the cells to be driven simultaneously in the same way.

Figure 4:
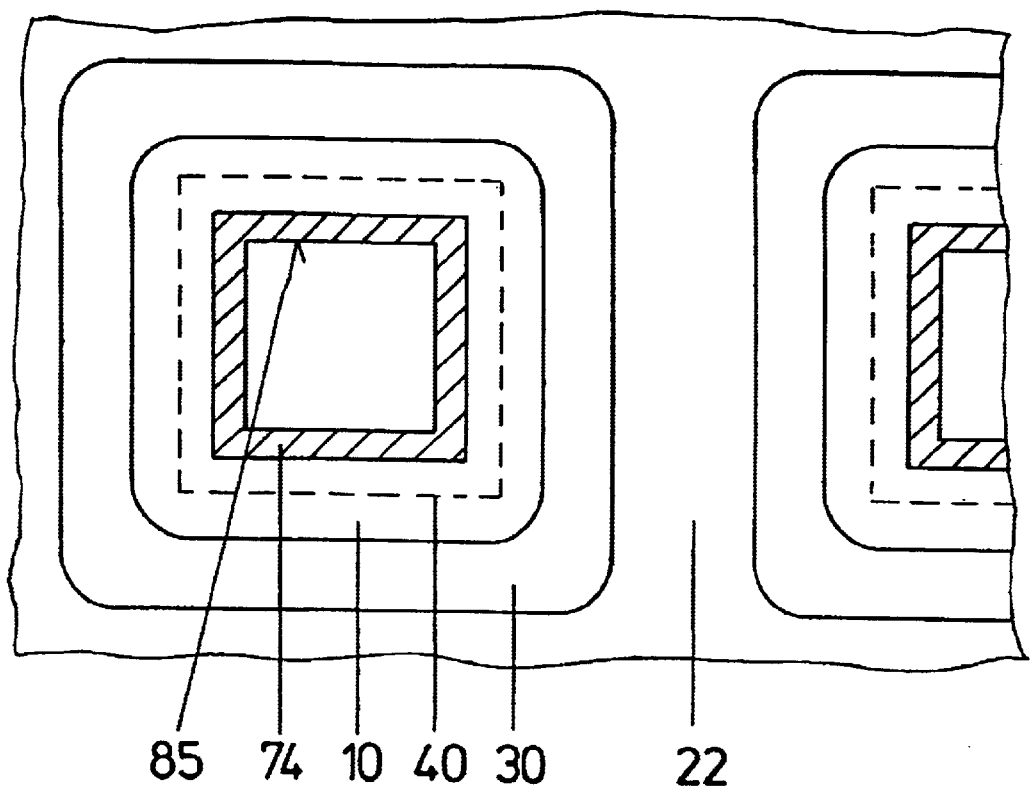
FIG. 4 shows a cross section through the configuration shown in FIG. 2, along the section line A–A' in the case of a first embodiment.
Figure 5:
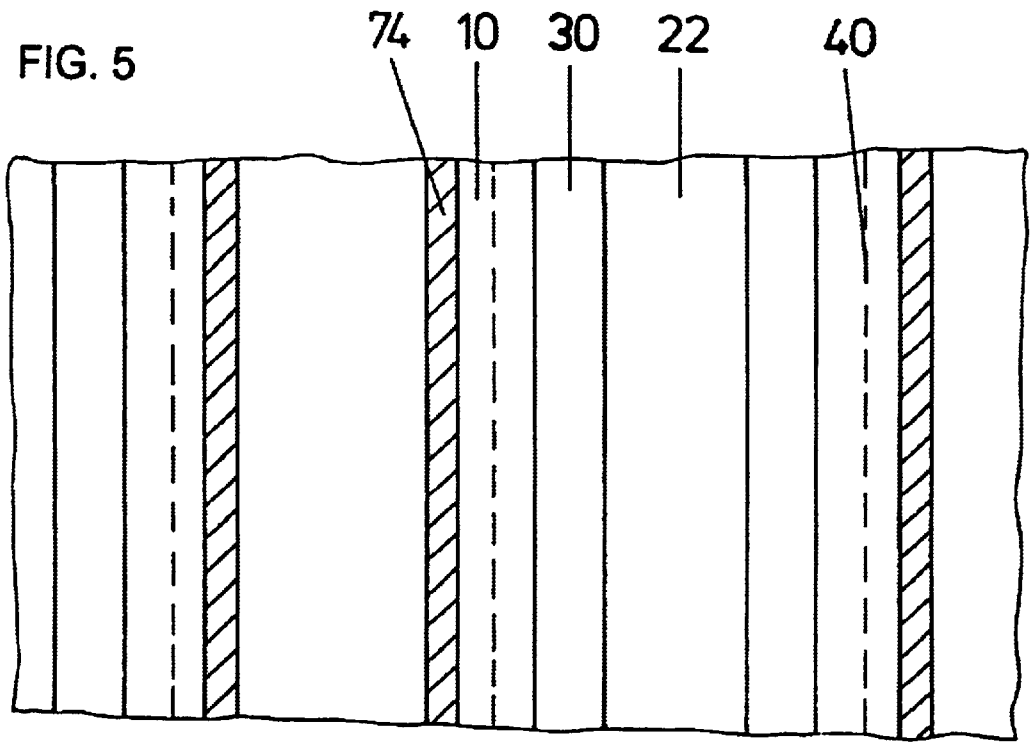
FIG. 5 shows a cross section through the configuration shown in FIG. 2, along the section line A–A' in the case of a second embodiment.

In FIGS. 4 and 5, two different exemplary embodiments of a semiconductor switching element according to the invention with different configurations of the contact hole, or of the regions laterally surrounding the contact hole, are represented. The representation in FIGS. 4 and 5 corresponds to a cross section along the section line A–A' depicted in FIG. 2.

FIG. 4 shows a cell with a substantially square contact hole 85. The second insulation layer 74, the first connection zone 10 and the body zone 30 enclose the contact hole from all sides. A multiplicity of cells of this type are preferably arranged next to one another in all directions in order to form the semiconductor switching element according to the invention, as is indicated by the further cell in FIG. 4, only a fragment of which is represented. The dashed line in FIG. 4 indicates the path of the control electrode 40 that is arranged above the semiconductor body 100. The control electrode 40 leaves the contact hole 85 and parts of the first connection zone 10 exposed in the upward direction.

In FIG. 5, the contact hole 85 is formed as a trench. The insulation layer 74, the connection zone 10 and the body zone 30 extend at least along the long sides of the trench-shaped contact hole 85. The control electrode 40 is also illustrated in FIG. 5 by a dashed line.

FIGS. 6a–6e show cross sectional views of a semiconductor switching element according to the invention during various process steps of a production process.

Figure 6A:
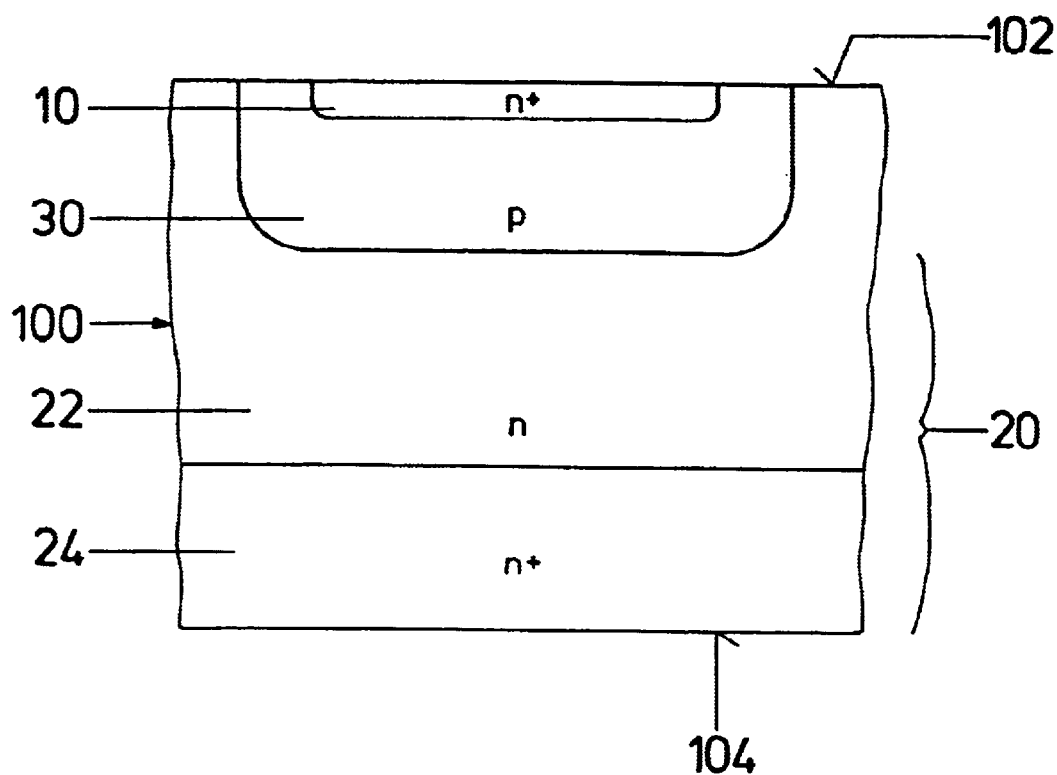
FIGS. 6a–6e show a cross section through a semiconductor switching element according to the invention during various steps of a production process.

Referring to FIG. 6a, in this process firstly a semiconductor body 100 is prepared, in which a first n-doped connection zone 10, a second n-doped connection zone 20 and a body zone 30 arranged between the first and second connection zones 10, 20 are formed. For this purpose, preferably an n-doped semiconductor body is firstly prepared, the semiconductor body being strongly n-doped in the region of a rear side 104 of the semiconductor body and more weakly n-doped in the remaining regions, in order to prepare a strongly doped zone 24 and a more weakly doped zone 22 of the second connection zone 20. In the more weakly doped zone 22, a p-doped well is subsequently produced from the front side 102 of the semiconductor body 100 as a body zone 30, a strongly n-doped zone 10 in turn being produced in this body zone 30 as a first connection zone. The strongly n-doped well 10 is exposed toward the front side 102 of the semiconductor body and is surrounded in the semiconductor body 100 on all sides by the body zone 30. The form of the body zone 30 and of the first connection zone 10 is dependent on the form of the contact hole produced later, as can be seen from FIGS. 4 and 5.

Figure 6B:
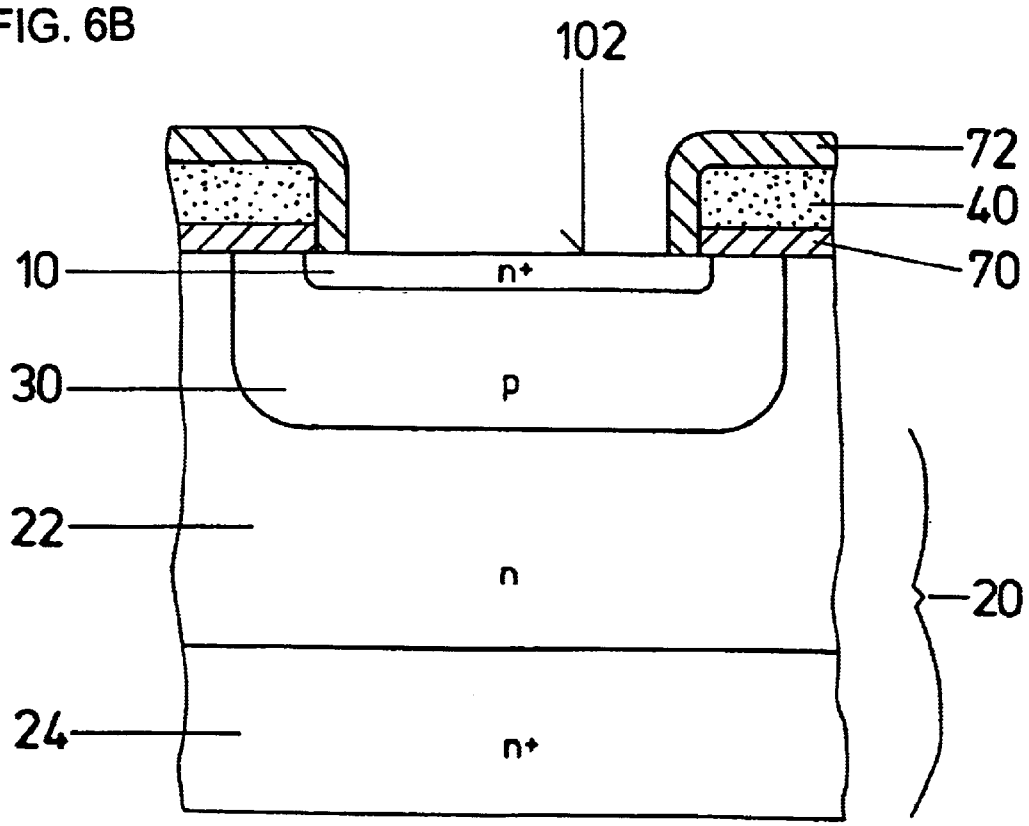

In the next process steps, the result of which is represented in FIG. 6b, a control electrode 40 which is surrounded by an insulation layer 70, 72 is produced over the front side 102 of the semiconductor body 100. The control electrode 40 is formed in such a way that it extends alongside the body zone 30 of the first connection zone 10 to the second connection zone 20 and leaves regions of the first connection zone 10 exposed on the front side 102 of the semiconductor body 100.

In a next process step (FIG. 6c), a contact hole 85 is produced in the exposed region of the first connection zone. The contact hole 85 reaches down in depth into the more weakly doped region 22 of the second connection zone 20. The dimensions of the contact hole 85 in the lateral direction are less in the exemplary embodiment than the dimensions of the first connection zone 10, so that regions of the first connection zone 10 are still exposed on the front side 102.

Figure 6C:
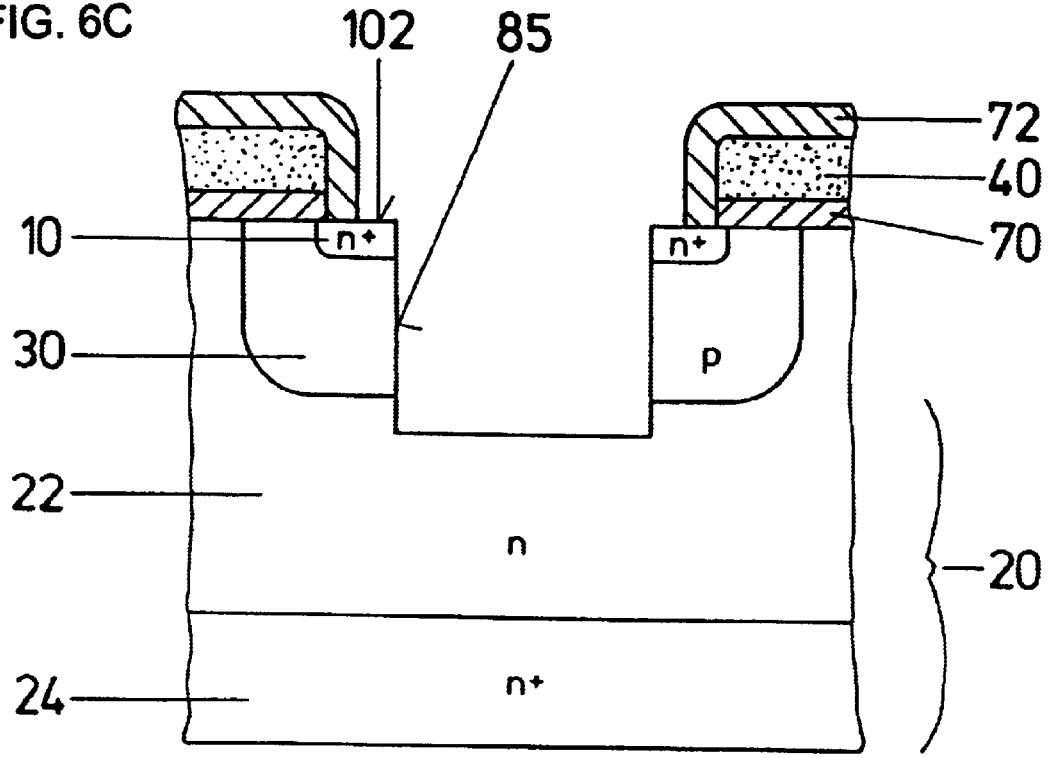
Figure 6D:
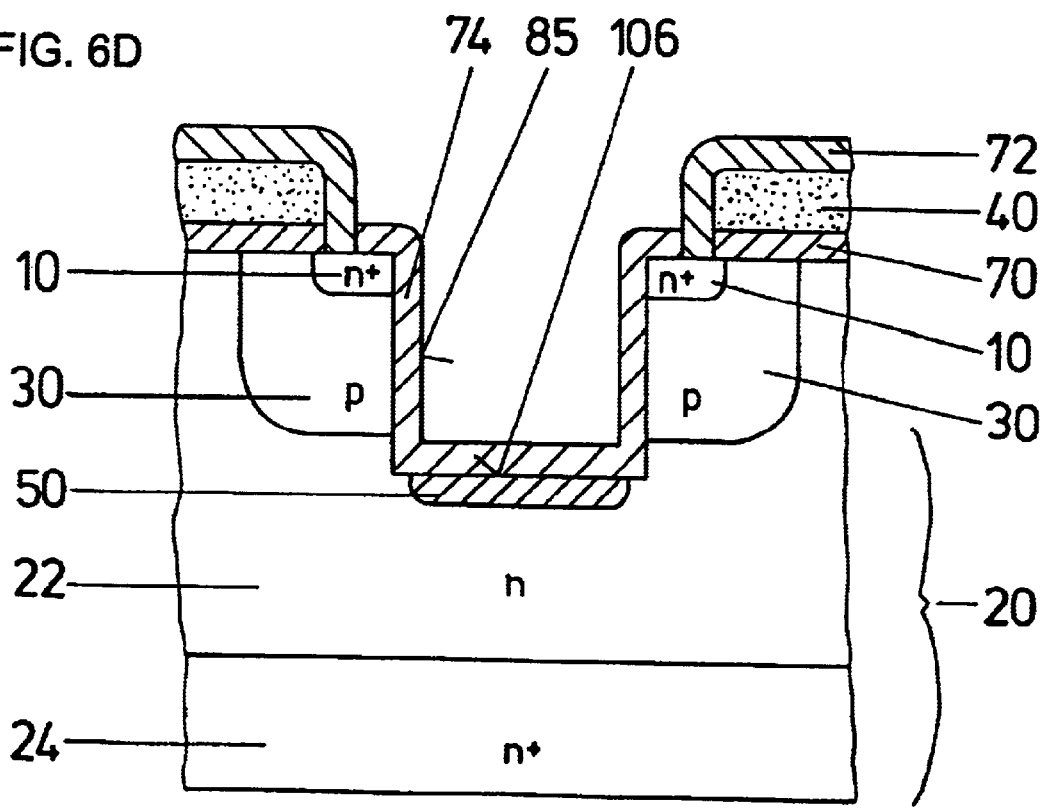

In the next process steps, the result of which is represented in FIG. 6d, a Schottky contact is produced in the second connection zone 20 on the bottom 106 of the contact hole 85. Subsequently, a second insulation layer 74 is deposited in the contact hole 85 and over the regions of the first connection zone 10 exposed on the front side 102.

In a next process step (FIG. 6e), the second insulation layer 74 is removed from the front side 102 of the semiconductor body and the bottom 106 of the contact hole, so that only the side faces of the contact hole 85 remain covered by the second insulation layer 74. Removal of the second insulation layer 74, is performed, for example, in an etching process. If an electrically conducting layer 60 is applied to the arrangement shown in FIG. 6e in a next process step, the semiconductor switching element according to the invention and represented in FIG. 2 is achieved.

According to a modification of the process as shown in FIGS. 6a–6e, but not represented in any more detail, it is provided that the contact hole 85 produced in the step shown in FIG. 6c takes up, in the lateral direction, the entire region of the first connection zone 10 that is exposed in the upward direction as shown in FIG. 6b. In this case, the second insulation layer 74 has to be etched back (in the step shown in FIG. 6e) far enough that the first connection zone 10 is exposed on the side faces of the contact hole 85, to allow the first connection zone 10 to be electrically bonded by the connection electrode 60 produced thereafter.

Figure 6E:
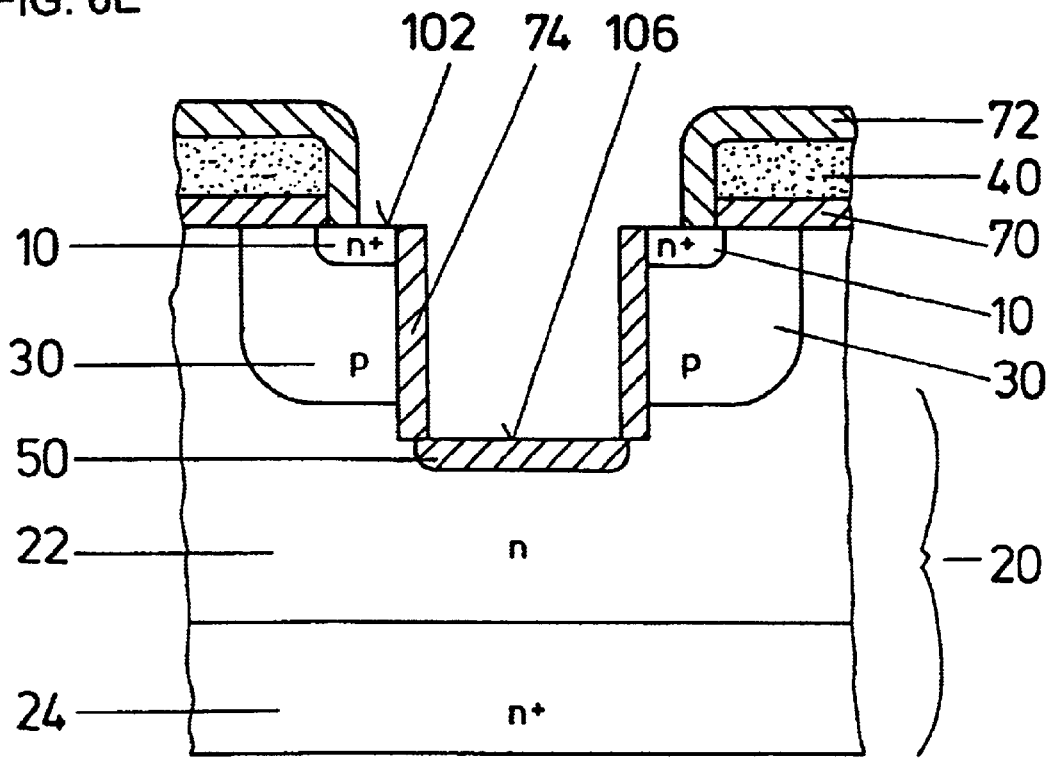

It goes without saying that the second insulation layer 74 may also be etched back further in the example represented in FIG. 6e, in order to expose regions of the first connection zone 10 on side faces of the contact hole 85. When doing so, the body zone 30 must not, on any account, be exposed.

Figure 7A:
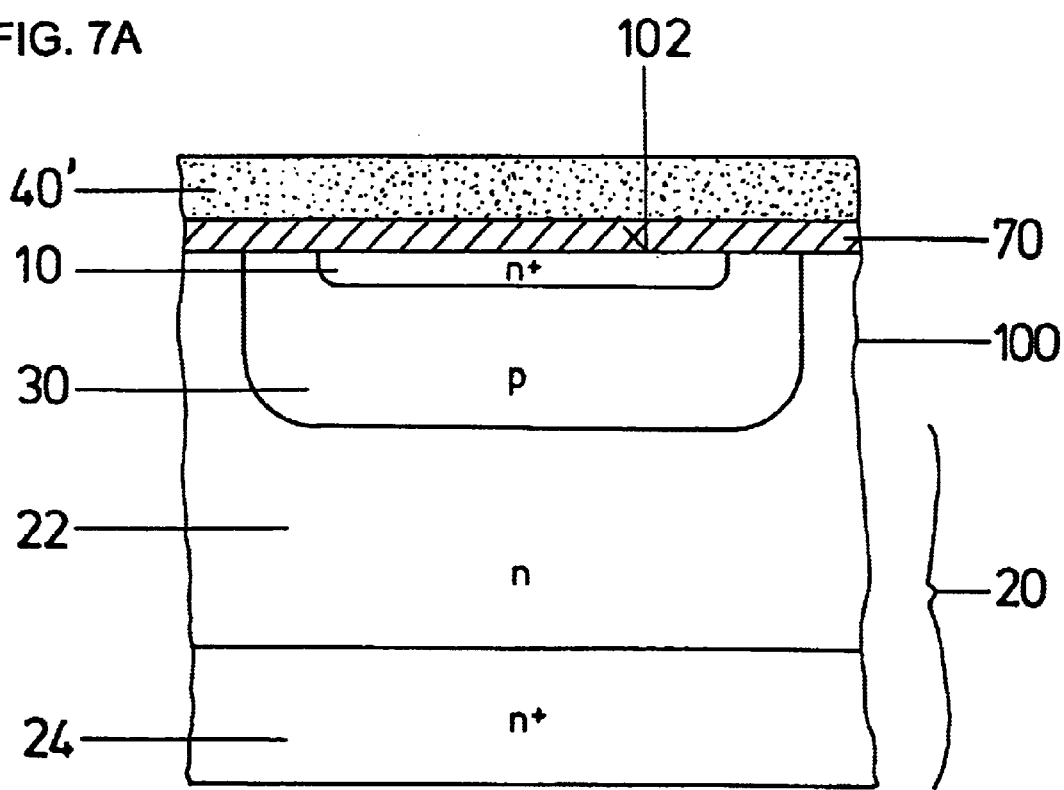
FIGS. 7a–7c show a cross section through a semiconductor switching element according to the invention during various steps of a first process for producing a control electrode.
Figure 7B:
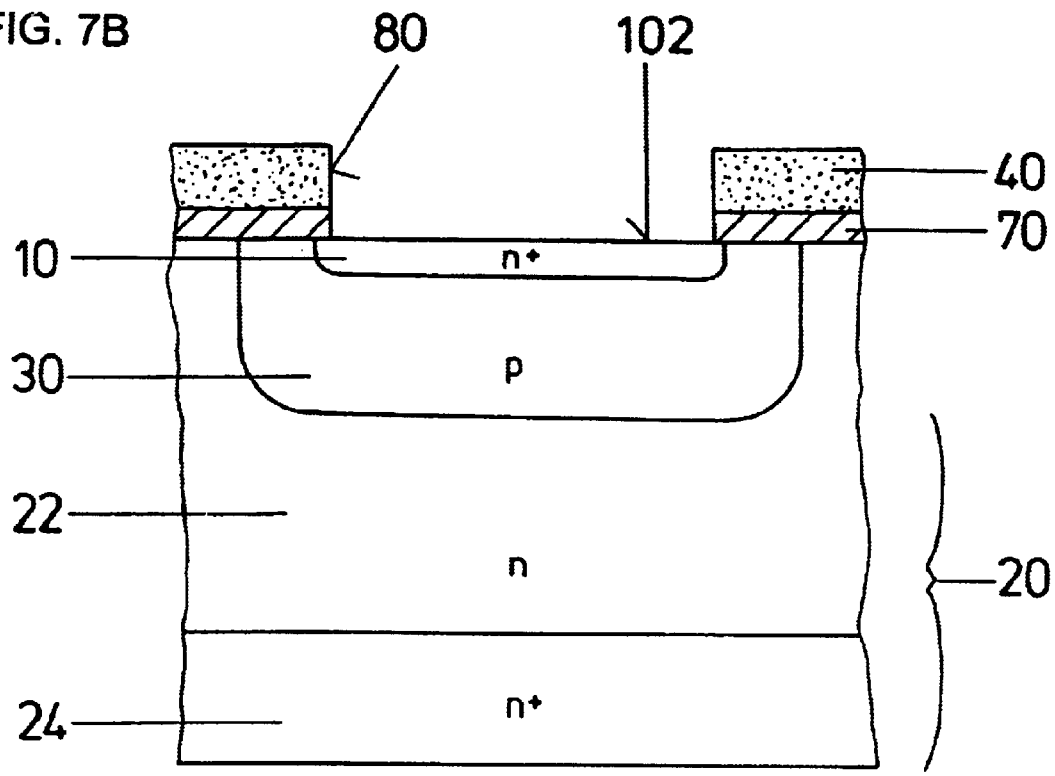
Figure 7C:
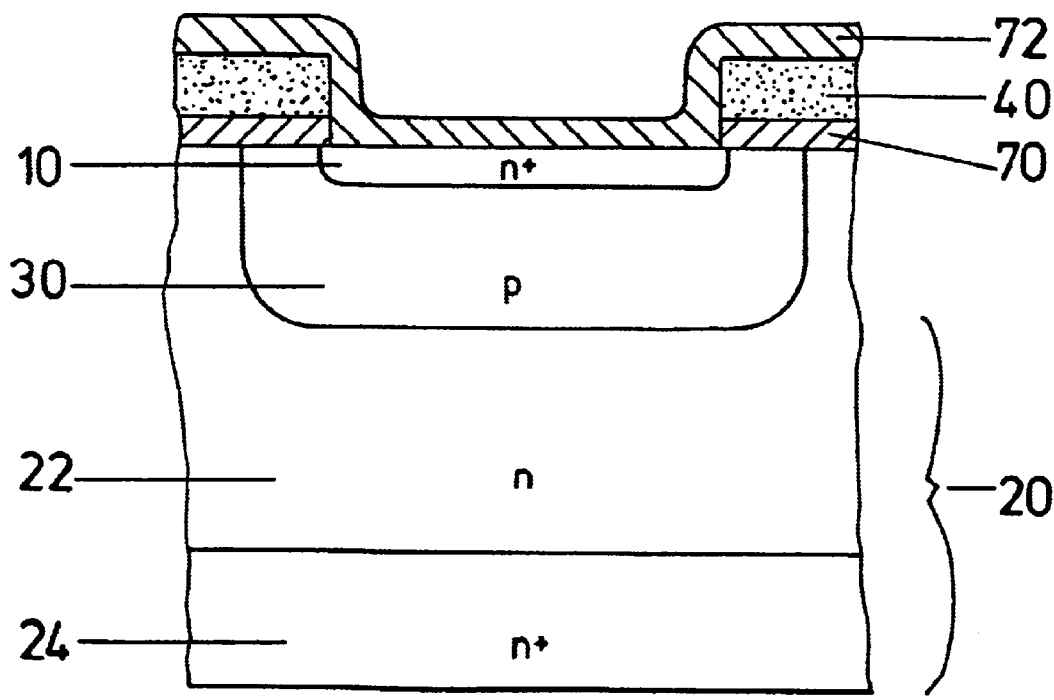

FIGS. 7a–7c illustrate a first process for producing the control electrode 40 that is surrounded by an insulation layer on the front side 102 of the semiconductor body 100. In this process, first an insulation layer 70 and an electrically conducting layer 40', forming the later control electrode, are deposited one on top of the other on the semiconductor body 100. Subsequently, a first contact hole 80 is produced in the insulation layer 70 and in the electrically conducting layer 40' in order to expose regions of the first connection zone 10. In a next process step (FIG. 7c), a further insulation layer 72 is applied over the arrangement shown in FIG. 7b. This further layer 72 is subsequently removed from the front side 102 of the semiconductor body, in order to achieve the arrangement shown in FIG. 6a. The result of the process shown in FIG. 7 is a control electrode 40 which is insulated with respect to the semiconductor body 100 and is still surrounded in the lateral and upward directions by a further insulation layer 72, in order to insulate it from the first connection electrode 60 that is produced later. Contact holes in the further insulation layer 72 that are required for the further connection of the control electrode are not represented in the figures.

Figure 8A:
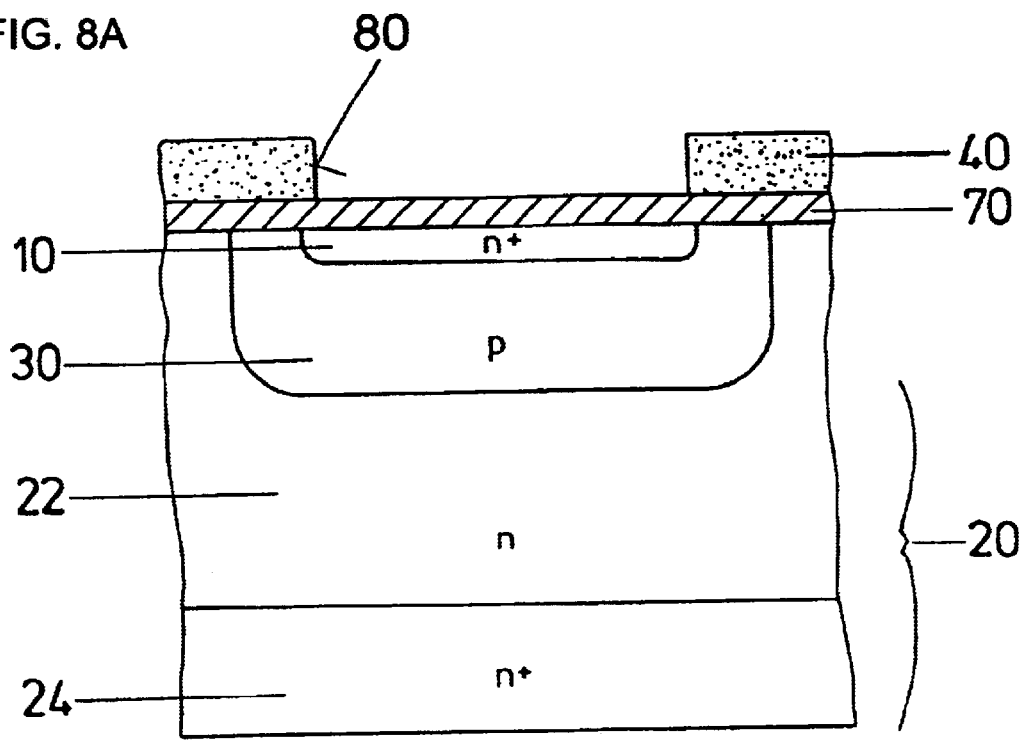
FIGS. 8a–8b show a cross section through a semiconductor switching element according to the invention during various steps of a further process for producing a control electrode.
Figure 8B:
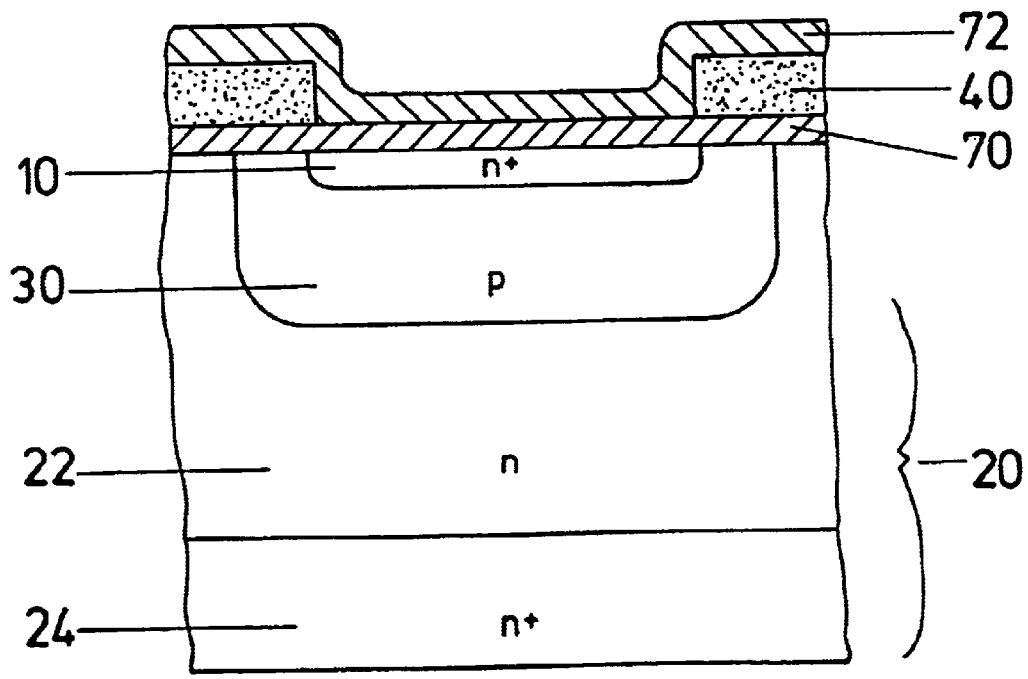

FIG. 8 shows a modified process for producing the control electrode. In this process, after depositing the first insulation layer 70 and the electrically conducting layer 40', first a contact hole 80 is produced only in the electrically conducting layer 40'. Subsequent to producing this contact hole 80, the second insulation layer 72 is applied and then removed together with the first insulation layer 70 from the front side 102 of the semiconductor body 100, in order to achieve the structure shown in FIG. 6.

I claim:

1. An integrated semiconductor switching element, comprising:

a semiconductor body having a first connection zone of a first conduction type, a second connection zone of the first conduction type, and a body zone of a second conduction type located between said first connection zone and said second connection zone, said body zone being formed in a well-like manner in said second connection zone, said first connection zone being formed in a well-like manner in said body zone, said semiconductor body being formed with a contact hole, said contact hole passing through said first connection zone and said body zone, said contact hole having a bottom and side walls;

a control electrode located alongside said body zone and insulated from said semiconductor body;

a Schottky barrier located on said second connection zone, said Schottky barrier being located in said contact hole and being formed on said bottom of said contact hole;

a first connection electrode electrically conductively connected to said first connection zone and to said Schottky barrier; and an insulation layer located on said side walls of said contact hole.

2. The semiconductor switching element according to claim 1, wherein:

said semiconductor body has a front side;

said first connection electrode at least partially covers said side walls and said bottom of said contact hole; and said first connection electrode at least partially covers said front side of said semiconductor body for electrically bonding said first connection zone.

3. The semiconductor switching element according to claim 1, wherein said Schottky barrier has platinum silicide.

4. A process for producing a semiconductor switching element which comprises:

providing a semiconductor body having a front side and having a first connection zone of a first conduction type and a second connection zone of the first conduction type, and configuring the first connection zone and the second connection zone one on top of the other;

providing the semiconductor body with a body zone of a second conduction type located between the first connection zone and the second connection zone;

producing at least one control electrode insulated from the semiconductor body and located alongside the body zone on the front side of the semiconductor body;

producing the control electrode causing the first connection zone being at least partially exposed and defining exposed regions of the first connection zone on the front side of the semiconductor body;

producing a contact hole with a bottom and side walls in the semiconductor body, the contact hole passing from the front side of the semiconductor body through the first connection zone and through the body zone and reaching into the second connection zone;

producing a Schottky barrier in the second connection zone in the contact hole;

applying an insulation layer on the side walls of the contact hole; and producing a first connection electrode electrically bonding Schottky barrier and the exposed regions of the first connection zone.

5. The process according to claim 4, wherein the step of producing the control electrode includes:

applying an insulation layer to the front side of the semiconductor body;

applying an electrode layer to the insulation layer;

producing a second contact hole in the electrode layer and in the insulation layer such that the first connection zone is at least partially exposed on the front side of the semiconductor body; and applying a further insulation layer to exposed regions of the control electrode.

6. The process according to claim 5, wherein the first contact hole has a smaller diameter than the second contact hole.

7. The process according to claim 4, which comprises:
producing the Schottky barrier by doping platinum silicide into the second connection zone.

* * * * *